United States Patent Office 3,556,791
Patented Jan. 19, 1971

3,556,791
PHOTOSENSITIVE COMPOSITIONS AND ELEMENTS AND A PROCESS OF MAKING FLEXOGRAPHIC PRINTING PLATE THEREFROM

Kenichi Suzuki, Tokyo, and Tsunetoshi Kai, Saitama-ken, Japan, assignors to Asahi Kasei Kogyo Kabushiki Kaisha, Kita-ku, Osaka, Japan, a corporation of Japan Filed Mar. 8, 1966, Ser. No. 532,574
Claims priority, application Japan, Mar. 11, 1965, 40/13,773
Int. Cl. G03c 7/00, 1/68
U.S. Cl. 96—35.1 7 Claims

ABSTRACT OF THE DISCLOSURE

Photosensitive compositions comprising (a) an unsaturated polyester produced from an alcoholic monomer containing at least one polyol having at least 5 ether-oxygen groups in its main chain and 3 or less carbon atoms between the ether-oxygen groups and an acidic monomer containing at least one unsaturated dicarboxylic acid, (b) an addition polymerizable ethylenically unsaturated monomer and (c) a photopolymerization initiator.

The present invention relates to novel photosensitive compositions which can be converted into insoluble and infusible elastomers having net-work structures by the action of actinic light. Furthermore, the present invention relates to a photosensitive element, which is particularly useful for making a flexographic printing plate, consisting of a layer of said photosensitive composition (hereafter this is described as a photosensitive layer) and a support. Also, the present invention relates to a process in which a flexographic printing plate is prepared of said photosensitive composition or a photosensitive element.

A flexographic printing is one printing method which is carried out by the use of an elastic printing plate in 25 to 80 of Shore Hardness (A) and a quick-drying ink, and is particularly most suitable for printing on a plastic film such as polyethylene, polypropylene or polyvinyl chloride, a metal foil such as aluminium, or again cellophane, glassine paper, kraft paper, corrugated board and so on.

In a process of making the flexographic printing plate, hitherto, a metal plate is initially prepared following the procedures of charcoaling or polishing (1), sensitizing solution coating (2), exposure (3), development (4), burning (5), pre-etching (6) and etching (7), and then a matrix is prepared by matrix molding (8), and finally a rubber plate is just obtained by vulcanization of raw rubber (9). These processes are very intricate and tedious and consequently, a lot of labor and skill are required for the plate making and the material cost is great, so that it has been greatly required to improve the plate making process of flexography.

Moreover, the rubber plate does not have very good resistance to organic solvents contained in printing ink and consequently its press life is not long.

Hitherto, a process for preparing relief images employing a photopolymerization step of ethylenically unsaturated compound by the action of actinic light is well known; and for example it is known in U.S. Pats. Nos. 2,673,151, 2,760,863, 2,902,365, 2,949,361 and 3,060,025, etc. However, those processes relate to a process for preparing hard plastic (printing) plates and do not enable the preparation of an elastic printing plate. Moreover, those printing plates don't have a totally good resistance to organic solvents contained in printing ink.

Furthermore, a composition which gives an elastomer by the action of actinic light is reported in U.S. Pat. No. 3,024,180. But, this composition is not soluble in water nor in any aqueous solution and is merely soluble in organic solvents. In consequence, when this composition is used particularly for preparing a printing plate, it is troublesome to use organic solvents in view of the cost and the danger of fire and furthermore it is unsuitable from the health viewpoint of the workers.

The present invention aims to provide novel photosensitive compositions which are entirely different from those compounds.

An object of the present invention is to provide novel photosensitive compositions which are capable of photo-crosslinking to give elastomers.

Another object of the present invention is to provide such photosensitive compositions that are easily soluble in water or aqueous solutions of acid, alkali or organic solute before photo-crosslinking.

A further object is to provide photosensitive elements, having photosensitive layers of the aforesaid compositions, which can be exposed and developed with water or an aqueous developing solution of acid, alkali or organic solute. A still further object is to provide a process in which flexographic printing plates are produced in a very simple procedure of exposure and development.

A still further object is to provide a flexographic printing plate which has an excellent resistance to organic solvent contained in flexographic printing ink and has a long press life.

The novel photosensitive compositions of the present invention comprise as the essential constituents and unsaturated polyester (the first component), an addition polymerizable, ethylenically unsaturated monomer (the second component) and a photosensitizer (the third component), wherein said unsaturated polyester is produced from (A) an alcoholic monomer containing at least one polyol having at least 5 ether-oxygen groups (bonded to carbon atoms) in its main chain and having not more than 3 carbon atoms between ether-oxygen groups and (B) acidic monomer containing at least one unsaturated dicarboxylic acid and/or its derivatives.

The compositions can contain polymerization inhibitors. Furthermore, the compositions can also contain inert filler materials.

A photosensitive layer of the aforesaid compositions can be easily deposited on an appropriate support to form a photosensitive element. This layer is easily soluble in water or aqueous developing solutions before exposure to actinic light.

When a selected portion of said photosensitive layer is irradiated by actinic light through an image-bearing transparency until a photo-crosslinking reaction is substantially completed, the exposed portion can form an insoluble and infusible elastic structure. And when the unexposed portion is removed by water or aqueous developing solution, an elastic relief can be produced on the support. Flexographic printing plates can be prepared by this method.

The unsaturated polyester, the first component of the present invention, can be synthesized by a conventional process. Usually, an unsaturated polyester is formed through such a reaction as direct esterification, ester interchange or addition reaction between a component substantially regarded as alcohol component, which involves polyol and/or its lower fatty acid ester and such additional amounts of compounds for modification as mono- or polyepoxy compound, monohydric alcohol or its lower fatty acid ester (hereafter this is described as alcohol component), and a component substantially regarded as acid component, which involves unsaturated polycarboxylic acid or its anhydride and/or its lower alcohol ester and/or its halogenides and such additional amounts of compounds for modification as saturated polycarboxylic acid or its derivatives such as anhydride, lower alcohol ester or halogenide, or saturated or unsaturated monocarboxylic acid (hereafter this is described as acid component).

We discovered that an unsaturated polyester, having such structural units in its main chain that are constituted of polyol having at least 5, preferably a range of 5 to about 140 of ether-oxygens (bonded to carbon atom) in the molecule and having not more than 3 intralinear carbon atoms between ether-oxygen groups, was soluble in water or aqueous solutions prior to photo-crosslinking but it indicated a better elasticity after photo-crosslinking.

On this occasion, when said polyol has 4 or more intralinear carbon atoms between ether-oxygen groups, the unsaturated polyester indicates remarkably a decreased solubility in water or aqueous solutions and an unfavorable elasticity after it is photo-crosslinked.

Moreover, when said polyol has 4 or less ether-oxygens (bonded to carbon atom), the unsaturated polyester indicates a lesser elasticity after it is photo-crosslinked, and is not suitable for the objects of the present invention. Said polyol may have any optional number of more than 5 ether-oxygens, but it has too large a number, for example, 200 or more ether-oxygens, the unsaturated polyester is deficient of mechanical strength (tensile strength and abrasion resistance) after photo-crosslinking, and is not suitable for the practical use.

As a polyol used for the present invention, the following examples are cited:

Polyethyleneglycol with the general formula of $$HO{-}(CH_2CH_2O)_n{-}H$$

wherein $n$ is 6 or more, preferably 6 to about 140 (about 300 to 6,000 by molecular weight).

Polypropylene glycol with the general formula of $$HO{-}(CH_2{-}\underset{\displaystyle CH_3}{\underset{|}{C}H}{-}O)_n{-}H$$

wherein $n$ is 6 or more, preferably 6 to about 100 (about 350 to 6,000 of molecular weight).

Glycerine-polyoxypropyl ether triol with the general formula of

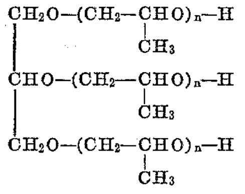

wherein $n$ is 3 or more, preferably 3 to about 50 (about 600 to 9,000 of molecular weight).

Trimethylolpropane-polyoxypropyl ether triol with the general formula of

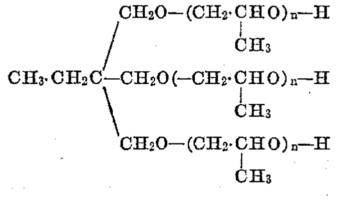

wherein $n$ is 3 or more, preferably 3 to about 50 (about 650 to 9,000 of molecular weight), and copoly(oxyethylene-oxypropylene) glycol, wherein the molecular weight is 300 or more, preferably 300 to 6,000.

For the purpose of improving mechanical strength or other physical and chemical properties (for example, solvent proof of elastomers formed through photo-crosslinking reaction, one part of alcohol component for raw material of unsaturated polyester is substituted by another alcohol component, having 1 to 4 ether-oxygens (bonded to carbon atom) or entirely none, and thereby the unsaturated polyester may be modified.

But, in order that the hydrophilic property before photo-crosslinking and the good elasticity after photo-crosslinking of the unsaturated polyester may not be impaired, the unsaturated polyester is preferably synthesized using such an alcohol component in which at least one kind of polyol having at least 5 ether oxygens (bonded to carbon atom) and having not more than 3 intralinear carbon atoms between ether-oxygen groups is contained at least $5+(5000/E)$ percent moles of total alcohol component, where E is the molecular weight of said polyol or an average molecular weight of two kinds or more of said polyols.

For example, if $i$ kinds of the aforesaid polyol are employed in molar amounts of $n_1, n_2 \ldots n_i$ respectively, the average molecular weight is given by the following formula $$E=\sum(M_iN_i/N)$$

wherein $M_i$ is the molecular weight for the $i$th polyol, having at least 5 ether-oxygens (bonded to carbon atom) in the molecules and $$N=n_1+n_2+\ldots+n_i$$

Consequently, for example, when polyethylene glycol in a molecular weight of 1540 and propylene gylcol are used as alcohol component monomers, it is preferably desired to use said polyethylene gylcol as the alcohol component in the amount of $5+(15000/1540)$ molar percent at least, namely 15 molar percent or more, based on total molar amount of said polyethylene glycol and propylene glycol.

A mixture consisting of 0.1 mole of glycerinepolyoxyporply ether triol (molecular weight: 1500) and 0.9 mole of polyethylene glycol (molecular weight: 1000) has an average molecular weight of 1050, so that for example, when ethylene glycol is used besides the said mixture, it is preferred that 19 molar percent or more of alcohol component monomer shall be a mixture of said glycerinepolyoxypropyl ether triol and polyethylene glycol.

Alcohol components or raw materials used for modifying the unsaturated polyester are as follows:

Ethyleneglycol, and/or polyethyleneglycol with the general formula of $HO{-}(CH_2{\cdot}CH_2{\cdot}O)_n{-}H$ wherein $n$ is 2 to 5, propyleneglycol and/or polypropyleneglycol with the general formula of $$HO{-}(CH_2{\cdot}\underset{\displaystyle CH_3}{\underset{|}{C}H_2}{\cdot}O)_n{-}H$$

wherein $n$ is 2 to 5, polymethyleneglycol with the general formula of $HO{-}(CH_2)_n{-}OH$ wherein $n$ is 3 to 6, polyhydric alcohol such as glycerine, Pentaerythritol and Sorbitol, and/or those lower fatty acid esters, and/or glycidyl ether, ethylene glycol diglycidyl ether, diethylene glycol-diglycidyl ether, polyepoxides such as 1,2;3,4-diepoxybutane, and/or epoxy resin with the general formula of

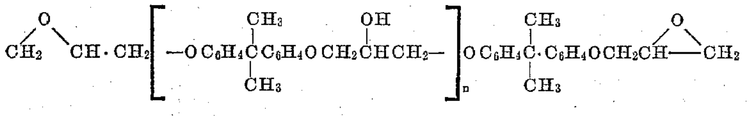

wherein $n$ is 0 to 40, monohydric alcohol such as octyl alcohol, decyl alcohol and octadecyl alcohol and/or monoepoxide such as ethylene oxide and propylene oxide.

Furthermore, alcohol components having an unsaturated group, such as butenediol, glycerine monooleate, allylalcohol and metallylalcohol are useful for obtaining photocrosslinked products of unsaturated polyester, which have a particularly high mechanical strength.

An unsaturated polyester is synthesized through the polycondensation reaction of the aforesaid alcohol component monomer and unsaturated polycarboxylic acid.

Usually, maleic acid, maleic anhydride, dimethyl maleate, diethylmaleate, fumaric acid, dimethyl fumarate, diethyl fumarate, chlormaleic acid, citraconic acid, citraconic anhydride, methaconic acid, itaconic acid, muconic acid and glutaconic acid are used as the aforesaid unsaturated polycarboxylic acid used in the synthesis of unsaturated polyester.

To improve solvent resistance and abrasion resistance of elastomers formed through the photo-crosslinking reaction, one part of the acid component of raw material of the unsaturated polyester is substituted by a polycarboxylic acid having no unsaturated groups for a monovalent saturated or unsaturated carboxylic acid, and thereby the unsaturated polyester can be modified. On this occasion, in order to obtain elastomers useful for the purpose of the present invention, it is preferred that the amount of unsaturated polycarboxylic acid be not less than 5 per cent moles of the total amount of the acid component.

If the amount of unsaturated polycarboxylic acid is less than 5 molar percent of the total amount of acid component, a photo-crosslinking reaction of unsaturated polyester is not caused beyond the condition of a soft-gel even if a crosslink is produced and thereby the practical usability will be nullified.

Acid components which can be used for modifying the unsaturated polyester are:

For example, succinic acid, glutaric acid, adipic acid, pimelic acid, phthalic acid, isophthalic acid, terephthalic acid, and/or these dimethylester, diethylesters, or acid chlorides and/or phthalic anhydride, benzoic acid, palmitic acid, stearic acid, oleic acid, linolic acid and linolenic acid.

As the second component of the present composition, an addition polymerizable, ethylenically unsaturated monomer, which has at least one $CH_2{=}C{<}$ group and has a boiling point greater than 100° C. at atmospheric pressure, is preferably selected in view of reactivity and easy handling.

For example, styrene, o-, m- or p-phenyl styrene o-, m- or p-methyl styrene, n-propyl- or n-butyl-acrylate, ethylene glycol-di-acrylate or methacrylate, diallylphthalate, triallylcyanurate, vinyl palmitate, vinyl stearate, ethylene glycol divinylether, and N-vinylcarbazole are usable as the aforesaid unsaturated monomer.

Further, the more preferable monomers are acrylamide, methacrylamide, N-methylolacrylamide, N-methylolmethacrylamide, N-allylacrylamide, α-acetoamidocrylamide, N,N′-methylenebisacrylamide, N,N′-hexamethylenebisacrylamide, N - vinyl succinimide, N - vinylphthalimide, o-, m-, or p-vinylphenol, 2,5-dihydroxystyrene, o-, m-, or p-aminostyrene, o-, m-, or p-vinylbenzoic acid, acrylic acid, α-chloroacrylic acid, methacrylic acid, ethyleneglycolmonoacrylate, ethyleneglycolmonomethacrylate diethleneglycol - mono - acrylate, diethleneglycolo-monomethacrylate, diethyleneglycol - di - acrylate, diethyleneglycol - di - methacrylate, triethleneglycol-mono-acrylate, triethyleneglycol - mono - methacrylate, triethyleneglycol - di - acrylate and triethlyeneglycol-di-methacrylate.

It is preferred to use at least one kind of unsaturated monomer in amounts from 5% to 60% by weight of the total amount of said unsaturated monomer and unsaturated polyester. When the amount of unsaturated monomer is less than 5% (by weight), the velocity of the photo-crosslinking reaction is very retarded and the mechanical strength after photo-crosslinking is low and this is disadvantageous in practical use. When said amount is more han 60% (by weight), the easticity after photo-crosslinking is impaired and this is undesirable.

We have ascertained that a photo-crosslinking reaction of the aforesaid unsaturated polyester and the aforesaid unsaturated monomer can be promoted by using a photopolymerization initiator, namely a photosensitizer.

Suitable photosensitizers for the present composition include benzoin, benzoin methyl ether, bezoin ethyl ether, α-methyl benzoin, α-ethyl benzoin, benzyl, diacetyl, 2-naphthalene sulfonylchloride, diphenyl disulfide, anthraquinone, benzophenone, di-tert-butylperoxide, eosine and thionine. These photosensitizers are used in the range of 0.001 to 10% by weight of the total amount of said unsaturated polyester and said unsaturated monomer.

When the amount of photosensitizer is too small, the photo-crosslinking reaction is retarded and this is disadvantageous in practical use. On other hand, when more than 10% (by weight) of photosensitizer is added, its photosensitization is not intensified for its amount, and the mechanical strength after photo-crosslinking is also reduced.

The photosensitizer compositions for the present invention can be obtained by mixing the aforesaid unsaturated polyester and the said unsaturated monomer with the photosensitizer.

The components are combined and heated in a range of 50° C. to 150° C. and mixed in a mixer such as a screw kneader and a roll; or, the components may be dissolved in a volatile solvent, for example, methanol, ethanol, benzene and acetone, and then said solvent evaporated.

The known inhibitors of polymerization can be employed for the purpose of storing the photosensitive composition of the present invention with stability. The polymerization inhibitors may be added to the aforesaid composition when its components are mixed together; or it may be preliminarily added to each component, prior to mixing of those components.

The polymerization inhibitors used for the present invention are hydroquinone, mono-t-butylhydroquinone, p-methoxyphenol, catechol, p-t-butylcatechol, 2,5-di-t-butylhydroquinone, benzoquinone, 2,5-diphenyl-p-benzoquinone, picric acid and di-p-fluorophenylamine.

The polymerization inhibitors are added in an effective amount so that they do not restrain a photo-crosslinking reaction, though they are added for controlling a thermal polymerization reaction (dark reaction).

Consequently, the additional amount of polymerization inhibitor is in range of 0.005 to 2.0% by weight of total amount of said unsaturated polyester and said unsaturated monomer.

It is well-known that high polymers can be reinforced with inert filler materials. The photosensitive composition of the present invention can also contain an inert filler material.

The photosensitive compositions for the present invention is acted on by light of a wave length between 2000 and 7000 A., namely, actinic light; thereby a photosensitizer is primary excited photochemically (a primary process of photochemistry), and a photo-crosslinking reaction in the unsaturated polyester is secondly caused (a secondary process of photochemistry) and then the said composition is converted into a net-work structural elastomer.

On this occasion, when the wave length of light is less than 2000 A., the photon energy becomes excessively great and consequently, all components of photosensitive composition are liable to decompose and thereby the mechanical strength of the elastomers produced is deteriorated. On the other hand, when the wave length of light is more than 7000 A., the photon energy becomes too small and thereby a photo-crosslinking reaction is not produced.

Consequently, the light source of actinic light used for the photosensitive composition of the present invention is preferably a carbon arc lamp or a superhigh pressure mercury lamp or a high pressure mercury lamp or a low pressure mercury lamp.

The photosensitive composition of the present invention is exposed through an image-bearing transparency, and thereby an exposed area of said composition becomes an elastic material in from one to twenty minutes. The nonimage portion, namely the non-exposed portion, can be removed by water or aqueous solution, such as, for example, an aqueous solution of acetic acid, an aqueous solution of potassium hydroxide or sodium hydroxide, and an aqueous solution of methanol of ethanol. If desired, organic solvents such as methanol, ethanol, acetone, methylcellosolve, trichloroethylene, ethyl acetate, n-butyl carbitol, benzene and toluene may be used.

When the photosensitive composition of the present invention is utilized particularly for a flexographic printing plate, said photosensitive composition may be coated around a cylinder of printing machine and thereby a relief image having elasticity may be formed directly on said cylinder, but on this occasion, it is not always convenient to effect a coating operation of the photosensitive composition in the press room. In other words, in order that a photosensitive layer having a uniform thickness and a smooth surface may be formed on a cylinder, more time and labor are still required, even if appropriate apparatus is provided. Consequently, the photosensitive composition of the present invention, can be more practically used in a convenient form of photosensitive elements, namely elements bearing a photosensitive layer consisting of said composition, wherein said composition is retained by a suitable support.

Such a photosensitive element, after being exposed and developed, can be immediately adhered to a cylinder and then can be used as a printing plate.

Generally, as a suitable support, sheets of natural or synthetic rubber such as, for example, styrenebutadiene rubber, acrylonitrile—butadiene rubber, polybutadiene rubber, ethylene-propylene rubber, polyurethane rubber, propylene oxide rubber and nitroso rubber, or sheets of synthetic high molecular composition such as, for example, polyethylene, polypropylene, polystyrene, polymethylmethacrylate, polyvinylchloride, polyethyleneterephthalate, polycaprolatcam, phenol resin and urea resin, or celloid sheet are particularly preferred from the view point of economy.

Besides the above, a metal plate of steel, aluminium, zinc, copper or magnesium may be used.

In these cases, fine grooves of straight or curved lines are preferably scratched on a surface of the support, or fine cavities or dents are preferably formed on it. The photosensitive layer is more securely retained owing to the aforesaid shape of the surface.

Furthermore, an elastic sheet of cured unsaturated polyester which is a constituent of the photosensitive compositions of the persent invention or similar unsaturated polyester may be used for the aforesaid support.

Moreover, an elastic sheet obtained by the photocrosslinking of the photosensitive composition of the present invention or similar composition may be used for it. On this occasion, the layer of said compositions may be deposited directly or through a transparent material which is afterwards easily removable, such as silicone grease, cellophane or a sheet of synthetic high polymer upon the transparent support, namely glass or a plastic sheet such as polyethylene terephthalate and polymethylmethacrylate; then actinic light can be irradiated through said transparent support so that, in said layer, the photo-crosslinking of the part adjacent to the support, namely the part nearer to light source, is substantially complete but the photo-crosslinking of the part nearer to the surface of said layer, namely the part located further from the light source, is not complete; and a layer of photosensitive composition, namely a photosensitive layer, is deposited upon the previously exposed layer. Then the maintenance of the image can be particularly improved.

When a cured unsaturated polyester is employed as a support, a reinfrocing material can be naturally used for it.

Such reinforcing materials include glass fiber, textile or woven cloth of cotton, hemp, polyamide fiber, polyester fiber, polyacrylonitrile fiber, polyvinylacetate fiber or polyvinylidene chloride fiber, or an unwoven cloth obtained from polyethylene terephthalate or polycaprolactum.

It is evident that any kind of support, in addition to the aforesaid supports, can be used despite the material quality, provided that it has sufficient strength to retain a relief image which is obtained by exposing and developing the photosensitive compositions of the present invention and that it can be easily equipped with a cylinder of a printing machine.

Of course, two kinds or more of the aforesaid support can be used in a combined form.

For example, a support in a combined form consisting of a sheet which is obtained by curing the same unsaturated polyester as the first component of the photosensitive composition of the present invention or similar unsaturated polyester and a sheet of aluminum or polyethylene telephtharate is preferably used from the viewpoint of size stability.

A suitable thickness of the aforesaid support is in range of 0.2 mm. to 10 mm. If the support is too thin, it does not have enough strength to retain the photosensitive layer and if it is too thick, its weight is increased and it becomes inconvenient to handle.

The photosensitive compositions of the present invention can be deposited, as a photosensitive layer, on a surface of the support by means of conventional pressing, extrusion or calendering apparatus.

The thickness of the photosensitive layer formed on the support can be changed optionally and usually, a photosensitive layer in 0.1 mm. to 10 mm. thickness is satisfactorily used as a layer of a photosensitive element for a flexographic printing plate.

The photosensitive composition of the present invention has an excellent photosensitivity and can be converted to a net-work structure in about 1 to 20 minutes after initiating the exposure.

After a selected part of the photosensitive layer of photosensitive elements is exposed, the said photosensitive elements can be developed by water or aqueous solutions in about 2 minutes to 15 minutes to give a printing plate.

The printing plate, after being dried, can be fitted immediately on a cylinder of a flexographic printing machine by means of adhesive tape, and a precise and sharp printing can be exercised by means of the flexographic printing ink.

As aforementioned, the plate-making process in flexographic printing can be remarkably abbreviated as a consequence of adopting the photosensitive element of the present invention, and the making of flexographic printing plates can be practiced through a simple process which comprises no intricate and tedious work.

Furthermore, the elastomer obtained from the photosensitive composition of the present invention has shown excellent swelling resistance against organic solvents such as ethylacetate, butylacetate, methanol, ethanol, acetone, methyl·ethyl·ketone, methylcellosolve, benzene and toluene, and therefore a high speed rotary printing can be effected by using the flexographic printing plate of the present invention and a quick drying ink, such as flexographic printing ink or photo-gravure ink which contains the aforesaid organic solvent.

Moreover, a flexographic printing plate obtained from the photosensitive elements of the present invention, compared with a conventional rubber plate, gives better transition of ink to paper, cellophane, polyethylene, polypropylene, polyvinylchloride and aluminum foil.

A flexographic printing plate obtained with the photosensitive elements of the present invention has a superior resistance against to printing abrasion and for example, in printing on kraft paper, flexographic printing was effected for 500,000 copies or more throughout one operation.

And those skilled in the art can surmise easily that the photosensitive compositions of the present invention can have other uses besides flexographic printing, for example, dry off-set printing or screen process printing or calio printing.

To explain the present invention more particularly, the following examples are given, but these are merely an exemplification and the present invention is not limited thereof.

EXAMPLE I (Synthesis of unsaturated polyester)

In an atmosphere of nitrogen gas, 0.4 mole of fumaric acid, 0.6 mole of phthalic anhydride, 0.7 mole of polyethylene glycol (average molecular weight: 600) and 0.3 mole of propylene glycol were charged and allowed to be reacted at 180° C. to 190° C. during approximately 15 hours and thereby, unsaturated polyester (Acid value: 7) was obtained.

Approximately 100 mg. of hydroquinone were added to the unsaturated polyester.

(Preparation of photosensitive compositions)

To 70 g. of unsaturated polyester obtained as above, 30 g. of acrylic amide, 2 g. of benzoin and approximate 30 mg. of 2,5-diphenyl parabenzoquinone were added and these were thoroughly mixed by a roll heated at approximately 90° C. and thereby a photosensitive composition was produced.

(Preparation of photosensitive elements)

The aforesaid photosenstive composition in a viscous state at 80° C. was coated on the surface of a polybutadiene rubber sheet of 2 mm. thickness wherein fine grooves of approximately 25 lines per one cm width were formed on said surface, and a cleanly polished iron sheet was pressed on the coated surface to form and a photosensitive layer approximately 1 mm. in thickness having a smooth surface on the sheet. The photosensitive element was then cooled.

(Preparation of printing plate)

A negative film carrying a transparent image was set on the photosensitive layer of the aforesaid photosensitive element and exposed to the light of a high pressure mercury lamp (270 w.) located about 30 cm. from said film surface for 7 minutes. Said photosensitive element after being exposed was developed for about 5 minutes by water at 30° C. and thereby an elastic relief image (Shore Hardness (A) was approximately 47) was obtained.

(Printing)

Kraft paper, corrugated board, cellophane and polyethylene film were printed by using the aforesaid printing plate and photo-gravure printing ink (as a solvent, butylacetate and xylole were included).

The results indicated a very favorable transition of ink, compared with a common rubber anastatic printing, and clear prints were obtained.

EXAMPLES II TO XII

Various kinds of unsaturated polyester were synthesized by various compositions of raw materials as indicated in Table 2, and following the procedure of Example I, photosensitive compositions were prepared. These soluble in water, 5% aqueous solution of caustic soda, 5% aqueous solution of caustic potash, aqueous solution of acetic acid, aqueous solution of ethanol, aqueous solution of acetone, aqueous solution of dioxane, benzene, toluene, acetone, methanol, ethanol and dioxane. In the same manner as described in Example I, but using the aforesaid compositions, printing plates were prepared and printing exercised thereby. Similar results as in Example I were obtained.

In addition, each composition was exposed in the same manner as described in Example I to give specimens of elastomers of 70 mm. in length, 25 mm. in width and 3 mm. in thickness, and specimens were then immersed in butyl acetate, methyl ethyl ketone and toluene for twelve hours. After immersion, each specimen scarcely changed in weight and Shore hardness (A), namely the degrees of increase in weight and decrease in hardness were in the range of 0 to 5% and 0 to 2%, respectively, based on the weight and hardness before immersion. Similarly, specimens of cured natural rubber and synthetic styrene-butadiene rubber were tested. The degrees of increase in weight and decrease in hardness of said rubbers were in the range of 10 to 90% and 30 to 60%, respectively, based on the weight and hardness before immersion.

TABLE 1

| Example No. | Compositions and molar ratios | Acid value of polymer | Shore hardness (A) after photo-cross-linking |
|---|---|---|---|
| II | FA/CA/AA/PEG300/PPG200 (0.5/0.2/0.3/0.6/0.4) | 8.2 | 75 |
| III | MA/PAA/PEG2000/PG (0.6/0.4/0.4/0.6) | 3.0 | 41 |
| IV | MAA/IA/PEG6000/PG (0.7/0.3/0.1/0.9) | 1.9 | 35 |
| V | FA/PAA/PPG400 (0.3/0.7/1.0) | 6.2 | 62 |
| VI | MAA/SA/PPG2000/EG (0.7/0.3/0.3/0.7) | 2.4 | 44 |
| VII | MAA/PPG2000/EG/PEG200 (1.0/0.2/0.5/0.3) | 2.5 | 47 |
| VIII | MAA/IA/PPG6000/EG/PEG200 (0.7/0.3/0.1/0.7/0.2) | 1.8 | 33 |
| IX | MA/CM/PAA/PEPG400 (0.3/0.2/0.5/1.0) | 6.8 | 72 |
| X | MAA/PEPG3000/EG (1.0/0.2/0.8) | 2.2 | 45 |
| XI | MAA/SA/PEPG3000/EG/PEG200 (0.8/0.2/0.2/0.4/0.4) | 2.5 | 38 |
| XII | MAA/IA/PEPG8000/EG/TMO (0.7/0.3/0.1/0.6/0.3) | 1.7 | 30 |

Note.—FA (fumaric acid), MA (maleic acid), MAA (maleic anhydride), CA (citraconic acid), IA (Itaconic acid), CM (chloromaleic acid), AA (Adipic acid), PAA (Phthalic anhydride), SA (Succinic acid), EG (Ethylene glycol), PG (propylene glycol), TMO (trimethylol propane monooleate), PEG 200 to 6000 (polyethlene glycol in 200 to 6000 of average molecular weight, respectively), PEPG 400 to 8000 (copoly(oxyethylene-oxypropylene) in 400 to 8,000 of average molecular weight, respectively).

EXAMPLE XIII 0.6 mole of maleic anhydride, 1.2 moles of phthalic anhydride and 1.7 moles of polyethylene glycol (average molecular weight: 300) were charged in a nitrogen atmosphere and allowed to be reacted at 180° C. or less for about 20 hours.

Then, 0.1 mole of tetraethylene glycol·monomethyl·ether was added and the mixture was allowed to react for 8 hours and then, 0.1 mole of trimethylolpropane-polyoxypropyl ether triol (average molecular weight: 800) was added to said mixture and these were allowed to react for an additional 8 hours. In the same manner as described in Example I, the obtained unsaturated polyester was applied to a copper plate of 0.3 mm. thickness as a support and a printing plate was prepared. The obtained elastic relief of said printing plate indicated approximately 65 by Shore Hardness (A).

EXAMPLE XIV 0.1 mole of dimethylmaleate, 0.2 mole of dimethylterephthalate 0.26 mole of polyethylene glycol 1000 (average molecular weight: 1000) and 0.02 mole of glycerine-polyoxypropyl ether triol (average molecular weight: 1500) were charged a nitrogen gas atmosphere and were allowed to be reacted at a maximum temperature of 160° C. for about 8 hours; and then 0.02 mole of allylalcohol was added and this mixture was reacted at 180° C. or less for about 8 hours and an unsaturated polyester was obtained.

In the same manner as described in Example I, but using the above-mentioned unsaturated polyester as a component of the photosensitive composition and a natural rubber sheet as a support, a printing plate was prepared. The obtained elastic relief of said printing plate indicated approximately 35 by Shore Hardness (A).

EXAMPLE XV 0.1 mole of maleic anhydride, 0.2 mole of phthalic anhydride and 0.25 mole of polypropylene·glycol (molecular weight:1200) were charged a nitrogen gas atmosphere and reacted at 180° C. or less for approximately 12 hours; and 0.05 mole of polyethylene glycol-diglycygyl ether (molecular weight:400) was added and this mixture was allowed to react for 4 hours and then, an unsaturated polyester (acid value:8) was obtained.

In the same manner as described in Example I, but using the above-mentioned unsaturated polyester as a component of the photosensitive composition and a styrene-butadiene rubber sheet as a support, a printing plate was prepared. The elastic relief of said printing plate indicated approximately 43 by Shore Hardness (A).

EXAMPLES XVI to XXXI 30 g. of various kinds of unsaturated monomers in Table 2, 1.5 g. of benzoin methylether and 20 mg. of paramethoxyphenol were added to 70 g. of unsaturated polyester obtained in Example X and thereby photosensitive compositions were prepared respectively. A 3 mm. thick layer of the said photosensitive compositions was deposited on an aluminum plate of 0.5 mm. thickness and exposed to a carbon arc lamp (3 kw.) located about one meter therefrom; elastomers having the hardness as shown in Table 2 were obtained.

TABLE 2

| Example No. | Unsaturated monomer | Shore hardness (A) after photo-crosslinking |
|---|---|---|
| XVI | N-methylol methacrylamide | 45 |
| XVII | N-allylacrylamide | 43 |
| XVIII | α-Acetoamidoacrylamide | 42 |
| XIX | N,N'-methylenebisacrylamide | 50 |
| XX | N,N'-hexamethylenebismethacrylamide | 48 |
| XXI | N-vinylphthalimide | 40 |
| XXII | p-Vinyl phenol | 42 |
| XXIII | 2,5-dihydroxystyrene | 41 |
| XXIV | p-Aminostyrene | 44 |
| XXV | p-Vinyl benzoic acid | 43 |
| XXVI | Methacrylic acid | 41 |
| XXVII | α-Chloroacrylic acid | 39 |
| XXVIII | Diethyleneglycol monoacrylate | 39 |
| XXIX | Diethyleneglycol dimethacrylate | 47 |
| XXX | Triethyleneglycol monoacrylate | 35 |
| XXXI | Triethyleneglycol dimethacrylate | 44 |

EXAMPLE XXXII

In the same manner as described in Example I, but changing the ratio of polyester per acrylamide to 96/4, 90/10, 50/50 and 40/60, printing plates were prepared.

The printing plate with the ratio of 96/4 gave a slight deformation on one part of the relief image when it was developed, and the one with the ratio of 40/60 indicated a slight swelling by alcoholic ink.

The one with the ratio of 90/10 and the one with the ratio of 50/50 gave both excellent rubber elastic bodies, even if the former was pliable, and these indicated Shore Hardnesses in the range of 43 to 80.

EXAMPLES XXXIII to XXXXIII 45 g. of methacrylamide, 5 g. of acrylic acid, 75 mg. of 2,5-di-tert-butylhydroquinone and various photosensitive promoters in variable amounts as indicated in Table 3 were added respectively to 100 g. of unsaturated polyester obtained in Example II and thereby various photosensitive compositions were prepared and exposed under irradiation conditions similar to Example I.

The times of terminating substantially the photocrosslinking were surveyed and these results are shown in Table 3.

TABLE 3

| Example No. | Photosensitive promoter | Addition amount, g. | Photo-crosslinking time, minutes |
|---|---|---|---|
| XXXIII | Benzoin | 0.1 | 20 |
| XXXIV | do | 1.0 | 8 |
| XXXV | Benzoin methyl ether | 1.0 | 5 |
| XXXVI | Benzoin ethyl ether | 1.0 | 7 |
| XXXVII | α-Methyl benzoin | 2.0 | 10 |
| XXXVIII | Diphenyl disulfide | 3.0 | 20 |
| XXXIX | 2-naphthalene sulfonyl chloride | 3.0 | 20 |
| XXXX | Diacetyl | 5.0 | 20 |
| XXXXI | Anthraquinone | 5.0 | 20 |
| XXXXII | Benzophenone | 8.0 | 30 |
| XXXXIII | Di-tert-butylperoxide | 10.0 | 90 |

EXAMPLE XXXXIV 20 g. of methacrylamide, 20 g. of N-methylolacrylamide, 10 g. of diethyleneglycoldiacrylate and 2 g. of α-methyl·benzoin were added to 100 g. of the unsaturated polyester obtained in Example I and a photosensitive composition (A) was prepared therefrom.

Further, composition (B), (C) and (D) were prepared adding hydroquinone to said composition (A) in amounts of 0.05, 1.8 and 2.5% by weight, respectively. These were stored in a dark room at 20° C. and tested in storage-stability. The thermal crosslinking of composition (A) occurred after approximately 30 days. On the other hand, the thermal crosslinking of composition (B), (C) and (D) did not occur after about 90 days or more.

After storage for 90 days, composition (B), (C) and (D) were exposed to actinic light as in Example I and the time for substantial completion of their photo-crosslinking reaction was measured. Compositions (B) and (C) were almost complete within about 20 minutes but that of composition (D) was not complete after an exposure of 60 minutes.

EXAMPLE XXXXV

A sheet of cellophane was stretched upon a transparent glass plate in 2 mm. thickness, upon which said compositions (A) described in Example XXXXIV were deposited as a layer of 1 mm. thickness.

Said layer was exposed through the aforesaid glass plate for 5 minutes under the same conditions described in Examples XVI to XXXI. The exposed layer was used as a support of a photosensitive layer which was to be newly deposited as described in the following.

A layer of the same photosensitive composition as described in Example I in 1 mm. thickness was deposited on the opposite surface to said glass plate of the exposed layer, following Example I and a photosensitive element was prepared removing said glass plate herefrom.

Then, a flexographic printing plate was prepared, similarly as the method in Example I, from the photosensitive elements obtained in the above.

Said cellophane was easily removed after development.

Similarly as in Example I, but using the said printing plate, 500,000 copies of polyethylene film were printed and any deformation of the relief image was scarcely visible.

EXAMPLE XXXXVI

After applying moisture to the cellophane attached to the photosensitive element obtained in Example XXXXV, said cellophane was removed therefrom. Then an aluminum sheet of 0.2 mm. thickness was adhered by the use of an epoxy-resin adhesive (Araldite, a product of Ciba Col., Ltd.), and here a new photosensitive element was obtained.

In the same manner as described in Example I, but using the newly obtained photosensitive elements, a flexographic printing plate was prepared thereby.

The printings were practised by the use of said printing plate in a press-room under both conditions of 10° C. and 30° C., and both sizes of picture patterns printed upon aluminum foils under said dual conditions were entirely identical.

EXAMPLE XXXXVII

Glass fibers were put on a transparent polymethylmethacrylate sheet of 2 mm. thickness so that the former have 0.5 mm. thickness, and a fused composition (A) described in Example XXXXIV was penetrated into said glass fiber to form a layer of 0.6 mm. total thickness of said glass fibers and said compositions (A).

This layer was exposed through the aforesaid polymethylmethacrylate for 4 minutes under the same conditions described in Examples XVI to XXXVI.

On the opposite surface to the glass plate of said exposed layer, a 0.5 mm. thick layer of photosensitive composition in Example I was deposited similarly as in Example I, and a photosensitive element was prepared.

A flexographic printing plate was prepared from the aforesaid photosensitive element, following the same method in Example I.

According to this flexographic printing plate, similarly as in Example I, 500,000 copies of cellophane film were printed, and the relief image was still retained perfectly.

EXAMPLE XXXXVIII

Instead of the glass fibers described in Example XXXXVII, (a) two sheets of woven cloth of polycaprolactum, each in the about 0.1 mm. thickness, (b) one sheet of cotton cloth of about 0.15 mm. thickness and (c) unwoven cloth of polyethyleneterephthalate of about 0.4 mm. thickness were used respectively and, similarly as in Example XXXXVII, three types of flexographic printing plates were prepared. Each plate showed very good flexibility and favorable ability of maintenance of the relief image.

What is claimed is:

1. A photosensitive element comprising a support of 0.2 to 10 mm. in thickness and a photosensitive layer of 0.1 to 10 mm. in thickness on said support, said photosensitive layer being constituted of a photosensitive composition consisting essentially of an unsaturated polyester, an addition polymerizable ethylenically unsaturated monomer having at least one $CH_2=C<$ group and a boiling point greater than 100° C. at atmospheric pressure, and a photo-polymerization initiator, said unsaturated polyester being produced from (A) an alcoholic monomer containing at least one polyol selected from the group consisting of polyoxypropyl-glycerine, polyoxy-propyltrimethylol propane and copoly-(oxyethylene-oxypropylene) glycol and having at least 5 ether-oxygen groups in its main chain and carbon atoms between the ether-oxygen groups and (B) an acidic monomer containing at least one unsaturated dicarboxylic acid selected from the group consisting of maleic acid, fumaric acid, dimethyl fumarate, maleic anhydride, chloromaleic acid, citraconic acid, mesaconic acid, citraconic anhydride, and itaconic acid; said monomer being present in an amount of between 5 and 60% by weight of the total of monomer and polyester, said unsaturated polyester being water soluble and upon exposure to actinic light being photo-crosslinked to form an insoluble elastomeric substance.

2. A photosensitive element as set forth in claim 1, wherein the support is a sheet of a member selected from the group consisting of natural rubber, synthetic rubber, synthetic resin and metal.

3. A photosensitive element as set forth in claim 1, wherein the support is a sheet obtained by crosslinking the unsaturated polyester.

4. A photosensitive element as set forth in claim 1, wherein the support is a sheet of the unsaturated polyester reinforced with glass fibers, a cloth of natural or synthetic fibers, or an unwoven cloth.

5. A process for preparing photosensitive elements which comprises depositing a layer of a photosensitive composition on a transparent support, said composition consisting essentially of an unsaturated polyester, an addition polymerizable ethylenically unsaturated monomer having at least one $CH_2=C<$ group and a boiling point greater than 100° C. at atmospheric pressure, and a photopolymerization initiator, said unsaturated polyester being produced from (A) an alcoholic monomer containing at least one polyol having at least 5 ether-oxygen groups in its main chain and carbon atoms between the ether-oxygen groups and (B) an acidic monomer containing at least one unsaturated dicarboxylic acid selected from the group consisting of maleic acid, fumaric acid, dimethyl fumarate, maleic anhydride, chloromaleic acid, citraconic acid, mesaconic acid, citraconic anhydride, and itaconic acid, exposing said layer to actinic light through the aforesaid transparent support, such that, within said layer, photo-crosslinking of the part adjacent to said support is substantially complete while photo-crosslinking of the part nearer the surface of said layer is not complete, and again depositing a photosensitive layer of said photosensitive composition upon the layer previously exposed to actinic light.

6. A process for preparing flexographic printing plates which comprises forming a photosensitive element by depositing a layer of a photosensitive composition in a thickness of between 0.1 and 10 mm. onto a support having a thickness between 0.1 and 10 mm., said composition consisting essentially of an unsaturated polyester, an addition polymerizable ethylenically unsaturated monomer having at least one $CH_2=C<$ group and a boiling point greater than 100° C. at atmospheric pressure, and a photopolymerization initiator, said unsaturated polyester being produced from (A) an alcoholic monomer containing at least one polyol having at least 5 ether-oxygen groups in its main chain and carbon atoms between the ether-oxygen groups and (B) an acidic monomer containing at least one unsaturated dicarboxylic acid selected from the group consisting of maleic acid, fumaric acid, dimethyl fumarate, maleic anhydride, chloromaleic acid, citraconic acid, mesaconic acid, citraconic anhydride, and itaconic acid, exposing a selected area of the photosensitive layer to actinic light until photo-crosslinking of the exposed area of said layer is substantially completed, and subsequently removing the non-exposed area of said layer.

7. A photosensitive element as set forth in claim 1, wherein the support is a complex body composed of a member selected from a first group consisting of natural rubber, synthetic rubber, synthetic resin and metal and a member selected from a second group consisting of, sheets obtained by cross linking the unsaturated polyester and sheets of the unsaturated polyester reinforced with glass fibers, a cloth of natural or synthetic fibers or an unwoven cloth, and said photosensitive layer is deposited in contact with the member of said second group.

References Cited

UNITED STATES PATENTS

| | | | |
|---|---|---|---|
| 3,160,678 | 12/1964 | Lew | 260—861 |
| 2,956,878 | 10/1960 | Michiels et al. | 96—33 |
| 3,259,499 | 7/1966 | Thommes | 96—115 |
| 3,376,139 | 4/1968 | Giangualano et al. | 96—35.1 |

GEORGE F. LESMES, Primary Examiner

M. B. WITTENBERG, Assistant Examiner

U.S. Cl. X.R.

96—115, 67; 101—456; 260—75, 861, 866

UNITED STATES PATENT OFFICE

CERTIFICATE OF CORRECTION

Patent No. 3,556,791 Dated Jan. 19, 1971

Inventor(s) Kenichi Suzuki and Tsunetoshi Kai

It is certified that error appears in the above-identified patent and that said Letters Patent are hereby corrected as shown below:

Column 13, line 54: (Claim 1, line 15) after "and" insert -- 3 ( less--

Column 14, line 13: (Claim 5, line 11) after "and" insert --3 o: less--

Column 14, line 39: (Claim 6, line 13) after "and" insert --3 o1 less--

Signed and sealed this 7th day of March 1972.

(SEAL)
Attest:

EDWARD M.FLETCHER,JR.
Attesting Officer

ROBERT GOTTSCHALK
Commissioner of Patents